(12) United States Patent
Oh et al.

(10) Patent No.: US 11,081,586 B2
(45) Date of Patent: Aug. 3, 2021

(54) THIN FILM TRANSISTOR AND METHOD FOR MANUFACTURING THE SAME

(71) Applicant: ELECTRONICS AND TELECOMMUNICATIONS RESEARCH INSTITUTE, Daejeon (KR)

(72) Inventors: Himchan Oh, Sejong-si (KR); Sun Jin Yun, Daejeon (KR); Jeong Ik Lee, Daejeon (KR); Chi-Sun Hwang, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 16/672,838

(22) Filed: Nov. 4, 2019

(65) Prior Publication Data

US 2020/0144410 A1   May 7, 2020

(30) Foreign Application Priority Data

Nov. 5, 2018 (KR) .................. 10-2018-0134761
Apr. 4, 2019 (KR) .................. 10-2019-0039828
Oct. 22, 2019 (KR) .................. 10-2019-0131105

(51) Int. Cl.
*H01L 29/786* (2006.01)
*H01L 29/66* (2006.01)
*H01L 29/423* (2006.01)
*H01L 29/417* (2006.01)

(52) U.S. Cl.
CPC ...... *H01L 29/786* (2013.01); *H01L 29/41733* (2013.01); *H01L 29/42384* (2013.01); *H01L 29/66742* (2013.01)

(58) Field of Classification Search
CPC ............ H01L 29/786; H01L 29/66742; H01L 29/42384; H01L 29/41733; H01L 29/78618; H01L 29/78648; H01L 29/66795; H01L 29/78696; H01L 29/785
See application file for complete search history.

(56) References Cited

U.S. PATENT DOCUMENTS

| | | |
|---|---|---|
| 2009/0261389 A1 | 10/2009 | Cho et al. |
| 2014/0145180 A1 | 5/2014 | Oh et al. |
| 2018/0269332 A1* | 9/2018 | Hu ..................... H01L 27/1214 |
| 2018/0358386 A1* | 12/2018 | Choo ................. H01L 21/3212 |

OTHER PUBLICATIONS

Giovanni Santoruvo et al., "In-Plane-Gate GaN Transistors for High-Power RF Applications", IEEE Electron Device Letters, vol. 38, No. 10, Oct. 2017, pp. 1413-1416.

* cited by examiner

*Primary Examiner* — Mohammed R Alam
(74) *Attorney, Agent, or Firm* — Rabin & Berdo, P.C.

(57) ABSTRACT

Provided is a thin film transistor. The thin film transistor includes a substrate, a channel part extending on the substrate in a first direction parallel to an upper surface of the substrate, source/drain electrodes connected to both ends of the channel part in the first direction, and a gate electrode spaced apart from the channel part in a second direction intersecting the first direction and parallel to the upper surface of the substrate. Each of the channel part, the source/drain electrodes, and the gate electrode is provided as a single layer.

11 Claims, 8 Drawing Sheets

THIN FILM TRANSISTOR AND METHOD FOR MANUFACTURING THE SAME

CROSS-REFERENCE TO RELATED APPLICATIONS

This U.S. non-provisional patent application claims priority under 35 U.S.C. § 119 of Korean Patent Application Nos. 10-2018-0134761, filed on Nov. 5, 2018, and 10-2019-0039828, filed on Apr. 4, 2019, and 10-2019-0131105, filed on Oct. 22, 2019 the entire contents of which are hereby incorporated by reference.

BACKGROUND

The present disclosure relates to a thin film transistor and a method of manufacturing the same.

Due to the development of the information society, display devices capable of displaying information have been actively developed. The display device includes a liquid crystal display device, an organic electro-luminescence display device, a plasma display panel, and a field emission display device.

Such displays are widely applied to mobile phones, navigation, monitors, and televisions. Display devices include pixels arranged in a matrix, and thin film transistors that switch each pixel on and off. Each pixel is controlled by switching on/off of a thin film transistor.

The thin film transistor includes a gate electrode for receiving a gate signal, a source electrode for receiving a data voltage, and a drain electrode for outputting the data voltage. In addition, the thin film transistor includes an active layer for forming a channel. Recently, researches on the function and performance of thin film transistors have been actively in progress.

SUMMARY

The present disclosure provides a thin film transistor having improved structural stability and a method of manufacturing the same.

The present disclosure also provides a thin film transistor having improved electrical characteristics and a method of manufacturing the same.

The present disclosure also provides a thin film transistor which may be formed through a simple process and a method of manufacturing the same.

An embodiment of the inventive concept provides a thin film transistor including: a substrate; a channel part extending on the substrate in a first direction parallel to an upper surface of the substrate; source/drain electrodes connected to both ends of the channel part in the first direction; and a gate electrode spaced apart from the channel part in a second direction intersecting the first direction and parallel to the upper surface of the substrate; wherein each of the channel part, the source/drain electrodes, and the gate electrode is provided as a single layer.

In an embodiment, the channel part, the source/drain electrodes, and the gate electrode may be composed of the same material.

In an embodiment, the channel part and the source/drain electrodes may be composed of a single body In an embodiment, the channel part, the source/drain electrodes and the gate electrode may include a conductive metal oxide or a semiconductor material doped with an impurity.

In an embodiment, upper surface of the channel part may be located at a lower level than upper surface of the gate electrode.

In an embodiment, the substrate may have a recess provided between the channel part and the gate electrode, wherein the recess may be toward the inside of the substrate from the upper surface of the substrate.

In an embodiment, bottom surface of the recess may be located at a lower level than lower surface of the channel part and lower surface of the gate electrode.

In an embodiment, the gate electrode may be provided in plurality, wherein the channel part may be disposed between the gate electrodes.

In an embodiment, the thin film transistor may further include an insulating part provided between the channel part and the gate electrode.

In an embodiment of the inventive concept, a manufacturing method of a thin film transistor includes: forming a channel part, source/drain electrodes, and a gate electrode on a substrate; etching an upper portion of the channel part; and filling an insulating part between the gate electrode and the channel part, wherein the source/drain is formed in a single body with the channel part at both ends in a first direction of the channel part, wherein the gate electrode is formed to be spaced apart from the channel part in a second direction intersecting the first direction.

In an embodiment, the forming of the channel part, the source/drain electrodes, and the gate electrode may include: forming a preliminary layer on the substrate; and patterning the preliminary layer to form a channel part, source/drain electrodes, and a gate electrode.

In an embodiment, the forming of the channel part, the source/drain electrodes, and the gate electrode may include drawing, printing or stamping a semiconductor material on the substrate.

In an embodiment, the method may further include, before filling the insulating part, etching the channel part to reduce a width in the second direction of the channel part.

In an embodiment, the method may further include, before filling the insulating part, etching upper surface of the substrate exposed by the channel part and the gate electrode to form a recess.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
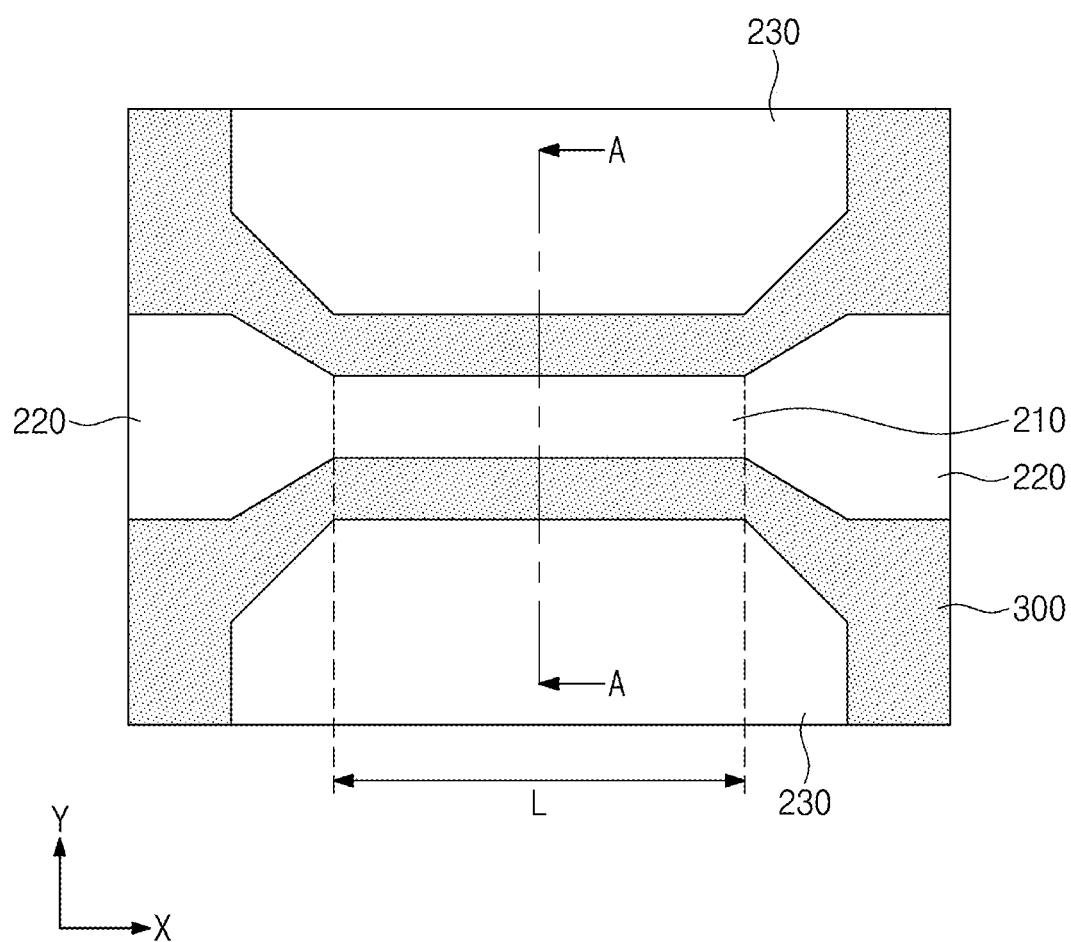
FIG. 1 is a plan view illustrating a thin film transistor according to embodiments of the inventive concept.

In order to fully understand the configuration and effects of the technical spirit of the inventive concept, preferred embodiments of the technical spirit of the inventive concept will be described with reference to the accompanying drawings. However, the technical spirit of the inventive concept is not limited to the embodiments set forth herein and may be implemented in various forms and various modifications may be applied thereto. Only, the technical spirit of the inventive concept is disclosed to the full through the description of the embodiments, and it is provided to those skilled in the art that the inventive concept belongs to inform the scope of the inventive concept completely. Those of ordinary skill in the art will understand that the concepts of the inventive concept may be practiced in any suitable environment.

The terms used in this specification are used only for explaining specific embodiments while not limiting the inventive concept. The terms of a singular form may include plural forms unless referred to the contrary. The meaning of "include," "comprise," "including," or "comprising," specifies a property, a region, a fixed number, a step, a process, an element and/or a component but does not exclude other properties, regions, fixed numbers, steps, processes, elements and/or components.

In this specification, when a film (or layer) is referred to as being on another film (or layer) or substrate, it may be directly on the other film (or layer) or substrate, or a third film (or layer) may be interposed.

It will be understood that the terms "first", "second", and "third" are used herein to describe various regions, films (or layers), and so on, but these regions, films (or layers), and so on should not be limited by these terms. These terms are only used to distinguish any predetermined region or film (or layer) from another region or film (or layer). Thus, a membrane referred to as a first membrane in one embodiment may be referred to as a second membrane in another embodiment. Embodiments described herein include complementary embodiments thereof. Like reference numerals refer to like components throughout the specification.

Unless otherwise the terms used in embodiments of the inventive concept are defined differently, they may be interpreted as commonly known to those skilled in the art.

Figure 2:
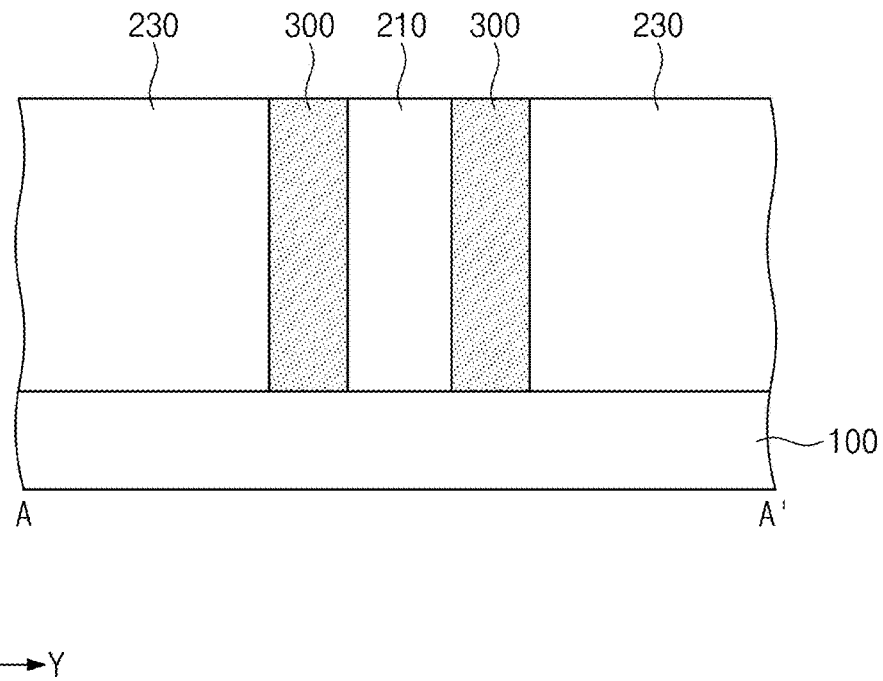
FIGS. 2 to 4 are cross-sectional views illustrating thin film transistors according to embodiments of the inventive concept.
Figure 3:
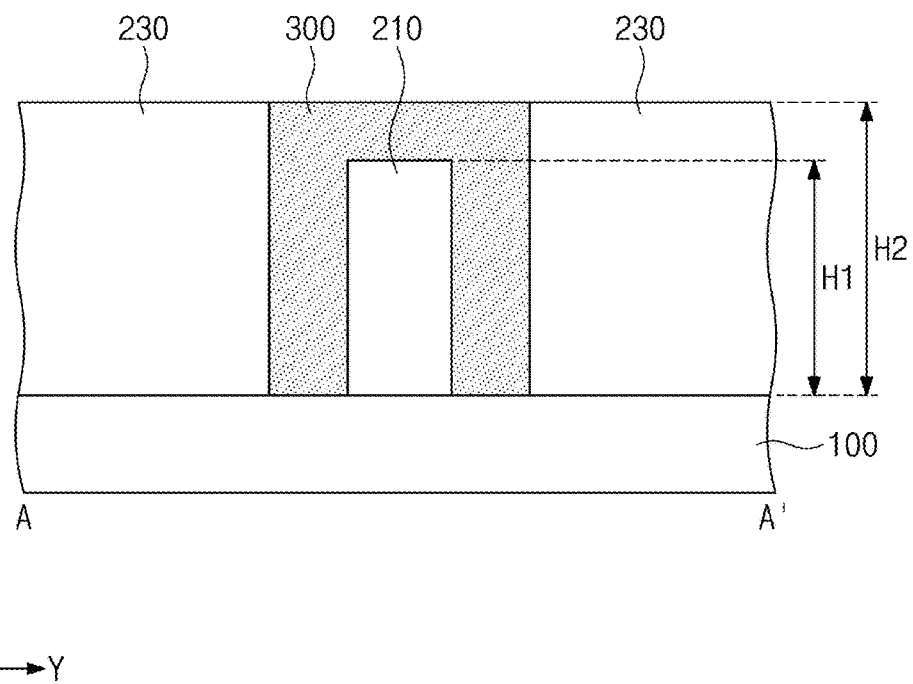
Figure 4:
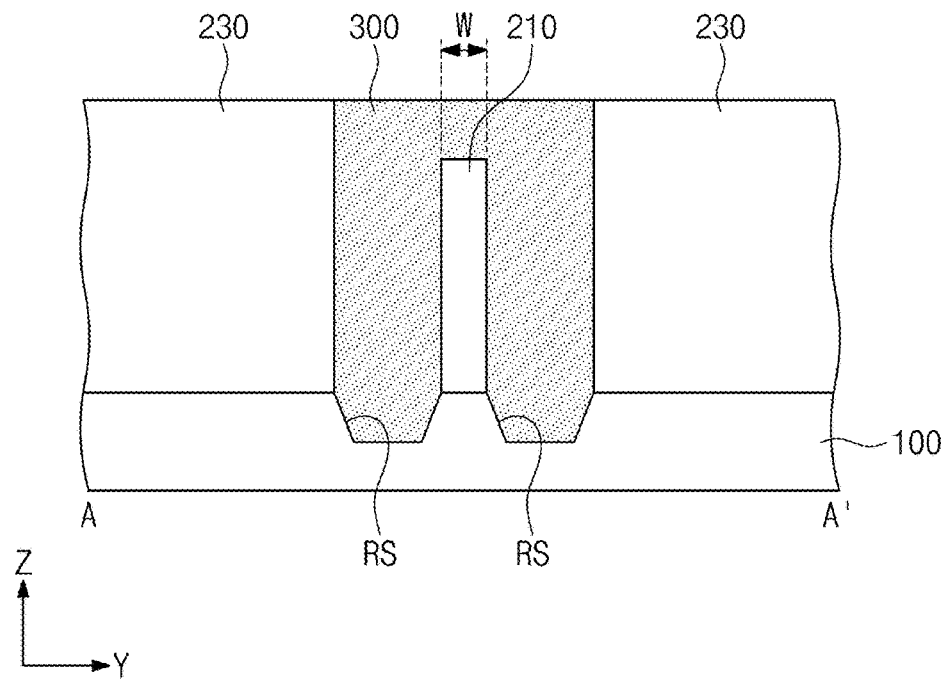

Hereinafter, a thin film transistor according to the concept of the inventive concept will be described with reference to the drawings. FIG. 1 is a plan view illustrating a thin film transistor according to embodiments of the inventive concept. FIGS. 2 to 4 are cross-sectional views illustrating thin film transistors according to embodiments of the inventive concept and are cross-sectional views taken along line A-A' of FIG. 1.

Referring to FIGS. 1 to 2, a substrate 100 may be provided. The substrate 100 may include an insulating substrate. Although not shown in the drawing, the substrate 100 may further include a buffer layer (not shown) provided on an upper surface thereof. The buffer layer (not shown) may be provided to alleviate a problem (e.g., lattice mismatch) that may occur at an interface between the substrate (substrate) and a channel part 210 described later, and a source/drain electrodes 220 and a gate electrode 230. Hereinafter, in the drawings, the first direction X and the second direction Y are defined as directions parallel to and perpendicular to the upper surface of the substrate 100. The third direction Z is defined as a direction perpendicular to the upper surface of the substrate 100.

The channel part 210 may be disposed on the substrate 100. The channel part 210 may extend in the first direction X. In plan view, the channel part 210 may have a predetermined width in the second direction Y and may have a bar shape extending in the first direction X. The channel part 210 may be composed of a single layer. That is, the channel part 210 may be a component composed of one material. The channel part 210 may be composed of a single layer. For example, the carrier concentration of the channel part 210 may be greater than $10^{18}$ cm$^{-3}$. The channel part 210 may include a semiconductor material having low resistance or a semiconductor material doped with impurities. For example, the semiconductor material may be silicon (Si), germanium (Ge), boron nitride (BN), gallium nitride (GaN), indium phosphide (InP), zinc oxide (ZnO), tin oxide (SnO), or indium oxide (InO). Unlike this, the channel part 210 may include a metal oxide such as indium tin oxide (ITO), indium zinc oxide (IZO) or aluminum-doped zinc oxide (AZO), or carbon (C). The channel part 210 may serve as a channel through which charge moves in the thin film transistor. For example, when a voltage is applied to the gate electrode 230 to be described later, a channel extending in the first direction X may be formed in the channel part 210.

The source/drain electrodes 220 may be disposed on the substrate 100. The source/drain electrodes 220 may be disposed at both ends of the channel part 210. The source/drain electrodes 220 may be disposed at both ends of the channel part 210. In plan view, the source/drain electrodes 220 may have a width greater than the width of the channel part 210. For example, the source/drain electrodes 220 and the channel part 210 may have an hourglass shape or a dumbbell shape in plan view. The source/drain electrodes 220 may be composed of a single layer. That is, the source/drain electrodes 220 may be a component composed of one material. The source/drain electrodes 220 may have high electrical conductivity. For example, the carrier concentration of the source/drain electrodes 220 may be greater than $10^{18}$ cm$^{-3}$. The source/drain electrodes 220 may include the same material as the channel part 210. The source/drain electrodes 220 may include a semiconductor material having low resistance or a semiconductor material doped with impurities. For example, the semiconductor material may be silicon (Si), germanium (Ge), boron nitride (BN), gallium nitride (GaN), indium phosphide (InP), zinc oxide (ZnO), tin oxide (SnO), or indium oxide (InO). Differently from this, the source/drain electrodes 220 may include a metal oxide such as indium tin oxide (ITO), indium zinc oxide (IZO) or aluminum-doped zinc oxide (AZO), or carbon (C), like the channel part 210. When the source/drain electrodes 220 are composed of the same material as the channel part 210, they may have a continuous configuration with the channel part 210, and the interface between the source/drain electrodes 220 and the channel part 210 may not be visible. That is, the source/drain electrodes 220 and the channel part 210 may be provided as a single body. For example, the source/drain electrodes 220 may be part of the channel part 210 extending to both sides of the first direction X. When the source/drain electrodes 220 are formed in a single body with the channel part 210, the resistance between the source/drain electrodes 220 and the channel part 210 may be low. When the source/drain electrodes 220 are formed in a single body with the channel part 210, the resistance between the source/drain electrodes 220 and the channel part 210 may be low. That is, the electrical characteristics of the thin film transistor may be improved. In addition, since the source/drain electrodes 220 are formed in a single body with the channel part 210, structural stability may be improved at the interface between the source/drain electrodes 220 and the channel part 210. That is, the thin film transistor may improve structural stability. In addition, each of the source/drain electrodes 220 may serve as a source and a drain of the thin film transistor, and may serve as a contact to which an external terminal (not shown) is connected. For example, since the source/drain electrodes 220 include a material having high electrical conductivity, the contact resistance with the metal may be low, and for example, a separate component such as an ohmic contact may not be needed for contact with an external terminal (not shown).

The gate electrode 230 may be disposed on the substrate 100. The gate electrode 230 may be disposed on one side of the second direction Y of the channel part 210. The gate electrode 230 may be spaced apart from the channel part 210. An interval between the gate electrode 230 and the channel part 210 may be constant along the first direction X. The gate electrode 230 may be composed of a single layer. That is, the gate electrode 230 may be a component composed of one material. The gate electrode 230 may have high electrical conductivity. For example, the carrier concentration of the gate electrode 230 may be greater than $10^{18}$ cm$^{-3}$. The gate electrode 230 may include the same material as the channel part 210. The gate electrode 230 may include a semiconductor material having low resistance or a semiconductor material doped with impurities. For example, the semiconductor material may be silicon (Si), germanium (Ge), boron nitride (BN), gallium nitride (GaN), indium phosphide (InP), zinc oxide (ZnO), tin oxide (SnO), or indium oxide (InO). Differently from this, the gate electrode 230 may include a conductive metal oxide such as indium tin oxide (ITO), indium zinc oxide (IZO) or aluminum-doped zinc oxide (AZO), or carbon (C), like the channel part 210. The gate electrode 230 may serve as a gate of the thin film transistor.

Only one gate electrode 230 may be provided, but as illustrated in FIGS. 1 and 2, a plurality of gate electrodes 230 may be provided. In this case, the channel part 210 may be disposed between the gate electrodes 230. That is, the gate electrodes 230 may be disposed to be spaced apart from each other in the second direction Y with the channel part 210 interposed therebetween. When a plurality of gate electrodes 230 is provided, channel formation and release of the channel part 210 may be easy. That is, the electrical characteristics of the thin film transistor may be improved.

In FIG. 2, upper surface of the gate electrode 230 is positioned at the same height as upper surface of the channel part 210, but the inventive concept is not limited thereto. As shown in FIG. 3, in the third direction Z from the upper surface of the substrate 100, the first height H1 of the channel part 210 is lower than the second height H2 of the gate electrode 230. The upper surface of the channel part 210 may be located at a lower level than the upper surface of the gate electrode 230. When a voltage is applied to the gate electrode 230, an electric field may be formed around the gate electrode 230. At this time, the electric field may be formed according to the shape of the gate electrode 230. For example, the electric field may be bent at the edge of the gate electrode 230. As shown in FIG. 3, when the upper surface of the channel part 210 is formed to be lower than the upper surface of the gate electrode 230, the channel part 210 may be affected only by a uniform electric field formed on side surface of the gate electrode 230. Accordingly, uniform channel formation in the channel part 210 may be easy.

In addition, as illustrated in FIG. 4, the width W of the second direction Y may be adjusted as necessary. In detail, when the carrier concentration of the channel part 210 is excessively high, it may not be easy to control the amount of charge of the channel part 210 by the gate electrode 230. When the width of the channel part 210 is narrow, the total amount of charge present in the channel part 210 may be reduced, and channel formation and release of the channel part 210 may be easier.

Referring to FIG. 2 again, an insulating part 300 may be disposed between the channel part 210 and the gate electrode 230. For example, the insulating part 300 may fill between the channel part 210 and the gate electrode 230 and/or between the source/drain electrodes 220 and the gate electrode 230. The insulating part 300 may electrically insulate the channel part 210 and the gate electrode 230, and the source/drain electrodes 220 and the gate electrode 230. The dielectric constant of the insulating part 300 may be higher than the dielectric constant of air. For example, the dielectric constant of the insulating part 300 may be 1.0 or more, preferably 1.5 or more. The insulating part 300 may include a high dielectric material. The insulating part 300 may include hafnium dioxide ($HfO_2$) or zirconium dioxide ($ZrO_2$). However, the inventive concept is not limited thereto, and the insulating part 300 may include various high dielectric materials. The insulating part 300 may not be provided as necessary. That is, air or a vacuum between the channel part 210 and the gate electrode 230 may be used as the dielectric of the thin film transistor.

Unlike those shown in FIG. 2, the insulating part 300 may extend into the substrate 100. As shown in FIG. 4, the substrate 100 may have a recess RS provided between the gate electrode 230 and the channel part 210. The recess RS may be formed to face the inside of the substrate 100 from the upper surface of the substrate 100. A bottom surface of the recess RS may be located at a lower level than the lower surface of the channel part 210 and the lower surface of the gate electrode 230. The insulating part 300 may fill the recess RS between the gate electrode 230 and the channel part 210. As the recess RS is formed between the gate electrode 230 and the channel part 210, the length of the electrical passage through the substrate 100 may be increased between the gate electrode 230 and the channel part 210. Accordingly, leakage current flowing through the substrate 100 may be reduced.

FIGS. 5 to 9 are cross-sectional views illustrating a method of manufacturing a thin film transistor according to embodiments of the inventive concept and are cross-sectional views taken along line A-A' of FIG. 1. Hereinafter, the contents overlapping with those described above will be omitted for convenience of description.

Figure 5:
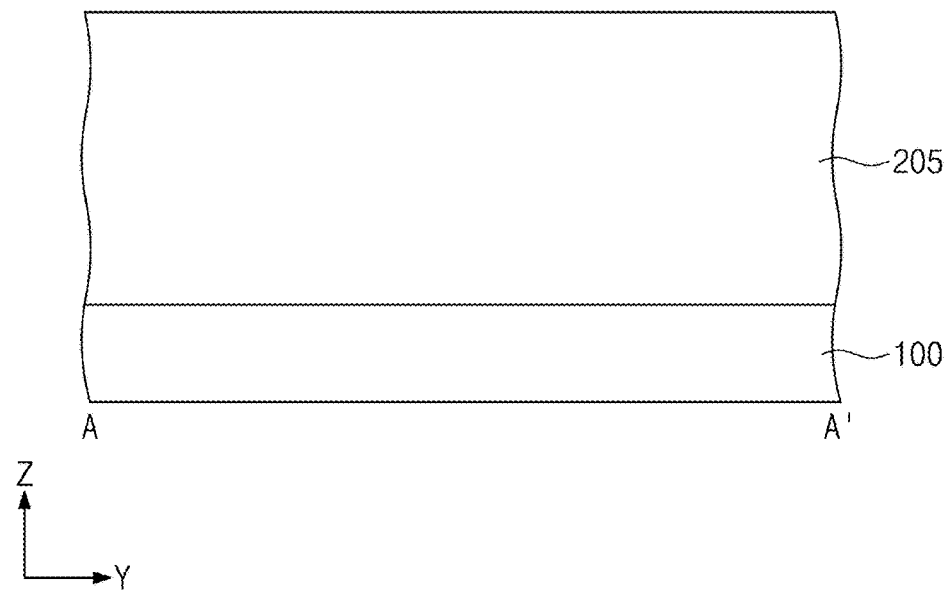
FIGS. 5 to 9 are cross-sectional views illustrating a method of manufacturing a thin film transistor according to embodiments of the inventive concept.

Referring to FIG. 5, the substrate 100 may be provided. The substrate 100 may include an insulating substrate.

A preliminary layer 205 may be formed on the substrate 100. For example, the preliminary layer 205 may be formed by depositing a semiconductor material on the substrate 100. When the preliminary layer 205 is formed of a semiconductor material, a process of doping impurities into the preliminary layer 205 may be further performed. The preliminary layer 205 may be formed through electron beam evaporation, sputtering, chemical vapor deposition (CVD), or the like. The preliminary layer 205 may include a semiconductor material having low resistance or a semiconductor material doped with impurities. For example, the semiconductor material may be silicon (Si), germanium (Ge), boron nitride (BN), gallium nitride (GaN), indium phosphide (InP), zinc oxide (ZnO), tin oxide (SnO), or indium oxide (InO). Differently from this, the preliminary layer 205 may include a conductive metal oxide such as indium tin oxide (ITO), indium zinc oxide (IZO) or aluminum-doped zinc oxide (AZO), or carbon (C).

Figure 6:
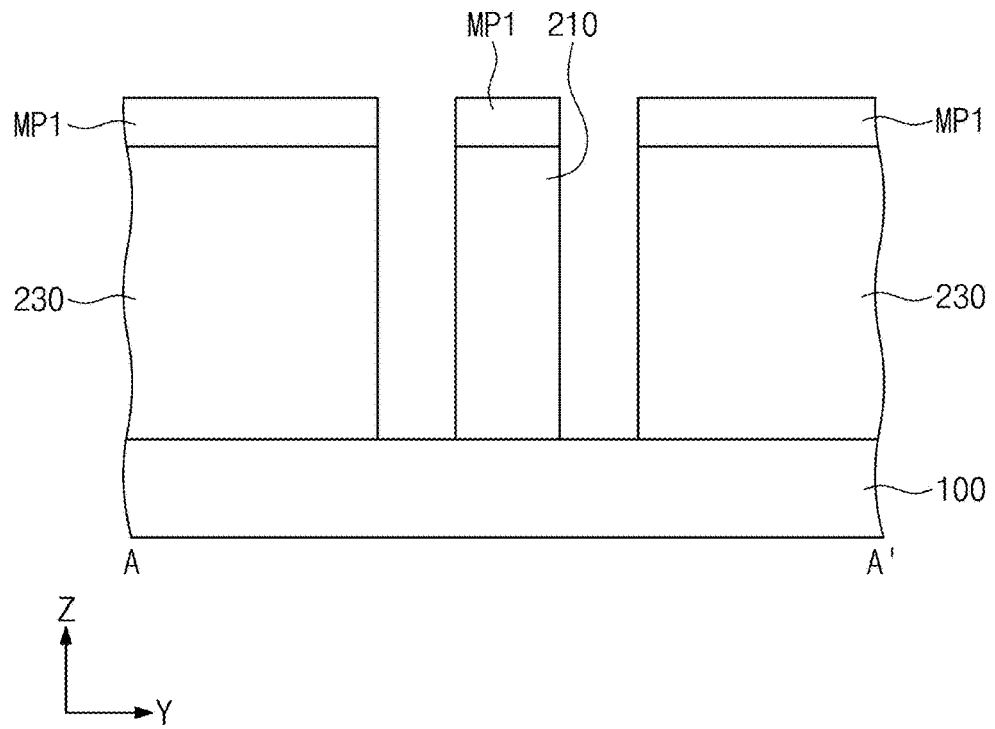

Referring to FIG. 6, the preliminary layer 205 may be patterned. For example, a first mask pattern MP1 may be formed on the preliminary layer 205. The first mask pattern MP1 may expose a portion of an upper surface of the preliminary layer 205.

An etching process may be performed on the preliminary layer 205 using the first mask pattern MP1 as an etching mask to form the channel part 210, the source/drain electrodes 220, and the gate electrode 230. The channel part 210 may be formed to extend in the first direction X. The source/drain electrodes 220 may be formed to be connected to both ends of the first direction X of the channel part 210, and may be formed in a single body with the channel part 210. The gate electrode 230 may be formed to be spaced apart from the channel part 210 in the second direction Y.

Thereafter, the first mask pattern MP1 may be removed.

According to other embodiments, the channel part 210, the source/drain electrodes 220, and the gate electrode 230 may be formed differently from those described with reference to FIGS. 5 and 6. For example, they may not be formed by patterning the preliminary layer. The preliminary layer may not be formed on the substrate 100, and the channel part 210, the source/drain electrodes 220, and the gate electrode 230 may be directly formed on the upper surface of the substrate 100. For example, the channel part 210, the source/drain electrodes 220, and the gate electrode 230 may be formed by performing a drawing, printing, or stamping process with a semiconductor material on the substrate 100.

The channel part 210, the source/drain electrodes 220, and the gate electrode 230 may be formed by performing a single etching process on the single layer preliminary layer 205. Alternatively, through one process using the same material, such as printing, the channel part 210, the source/drain electrodes 220, and the gate electrode 230 may be formed on the substrate 100. As described above, the channel part 210, the source/drain electrodes 220, and the gate electrode 230 of the thin film transistor according to the inventive concept may be formed using simple processes, and the manufacturing process of the thin film transistor may be simplified.

Figure 7:
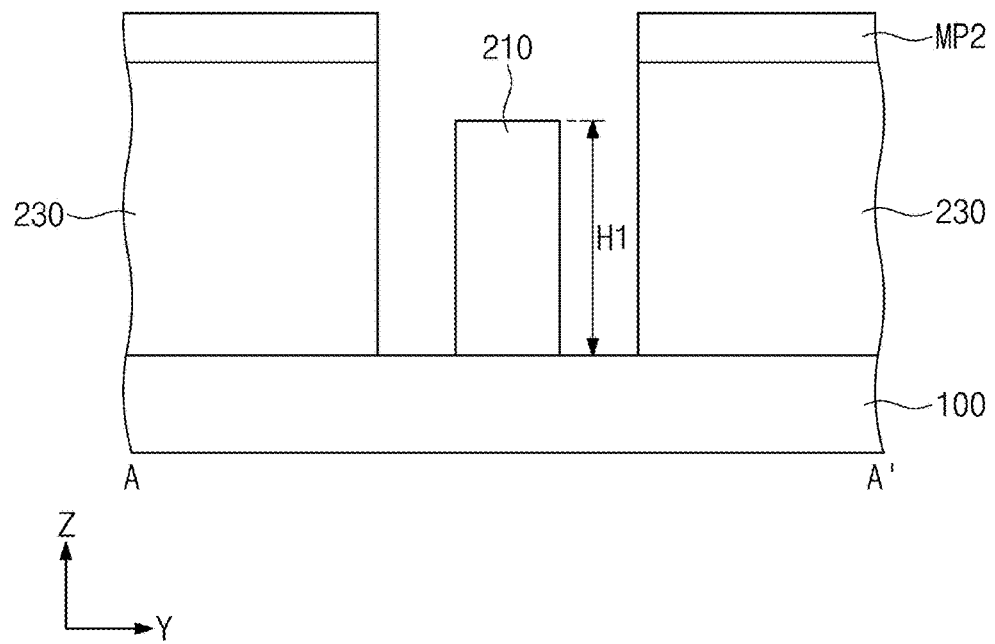

Referring to FIG. 7, an upper portion of the channel part 210 may be etched. For example, a second mask pattern MP2 may be formed on the source/drain electrodes 220 and the gate electrode 230. The second mask pattern MP2 may cover an upper surface of the source/drain electrodes 220 and the upper surface of the gate electrode 230 and expose the upper surface of the channel part 210. An etching process may be performed on the channel part 210 using the second mask pattern MP2 as an etching mask. The process of etching the upper portion of the channel part 210 may include an anisotropic etching process. The height H1 of the channel part 210 may be lowered by the etching process. In FIG. 7, the second mask pattern MP2 is formed after the first mask pattern MP1 is removed, but the inventive concept is not limited thereto. The second mask pattern MP2 may be formed by removing a portion of the first mask pattern MP1 (for example, a portion on the channel part 210).

Figure 8:
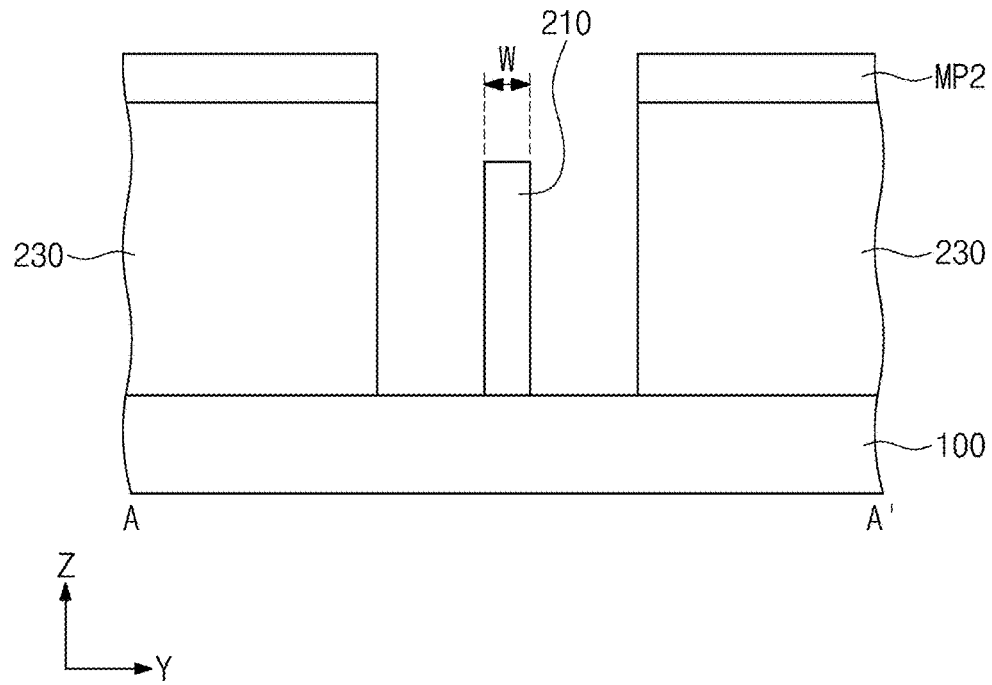

Referring to FIG. 8, the width W of the channel part 210 may be reduced by etching the channel part 210. For example, the channel part 210 may be etched using the second mask pattern MP2 (or the first mask pattern MP1 when not performing the process described with reference to FIG. 7) as an etching mask. The process of etching the channel part 210 may include an isotropic etching process. The etching process of the channel part 210 may be performed until it has a width required for the channel part 210. In embodiments, the etching process of reducing the width of the channel part 210 may be performed separately from or may be performed simultaneously with the etching process of lowering the height of the channel part 210. In addition, either an etching process for reducing the width of the channel part 210 and an etching process for lowering the height of the channel part 210 may not be performed as necessary, or both processes may not be performed.

Thereafter, the second mask pattern MP2 may be removed.

Figure 9:
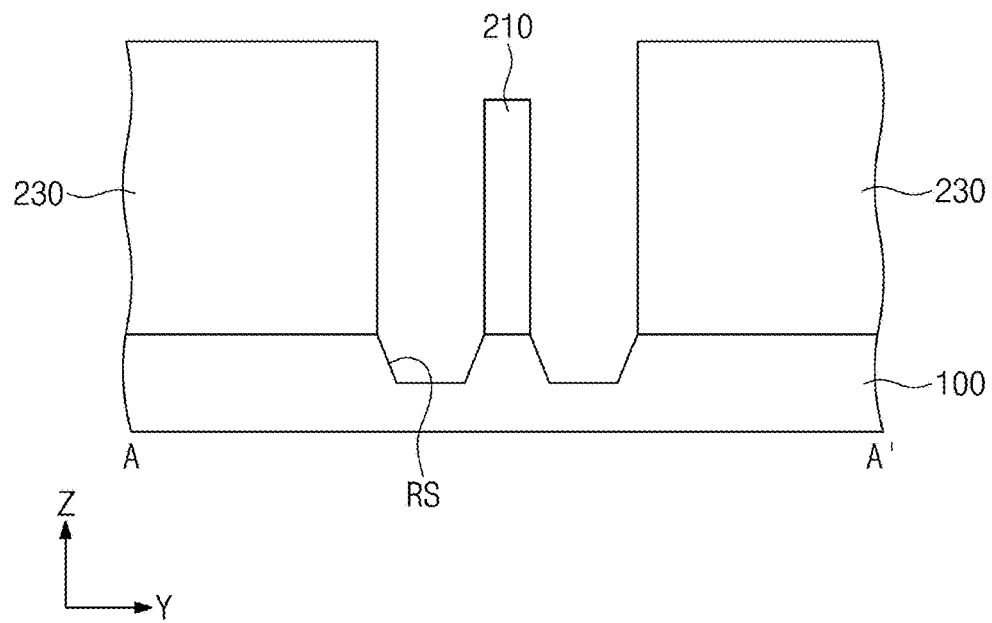

Referring to FIG. 9, the substrate 100 may be etched to form a recess RS. The recess RS may be formed by etching the upper surface of the substrate 100 exposed by the channel part 210, the source/drain electrodes 220, and the gate electrode 230. For example, an etching process may be performed on the upper surface of the substrate 100 using the channel part 210, the source/drain electrodes 220, and the gate electrode 230 as an etching mask. The recess RS may be formed to face the inside of the substrate 100 from the upper surface of the substrate 100. The bottom surface of the recess RS may be formed at a lower level than the lower surface of the channel part 210 and the lower surface of the gate electrode 230. The process of forming the recess RS may not be performed as necessary.

Referring to FIG. 4 again, an insulating part 300 may be formed between the channel part 210 and the gate electrode 230. For example, the insulating part 300 may be formed by filling an insulating material between the channel part 210 and the gate electrode 230, between the source/drain electrodes 220 and the gate electrode 230, and in the recess RS. The insulating material may include a high dielectric material. For example, the insulating material may include hafnium dioxide ($HfO_2$) or zirconium dioxide ($ZrO_2$).

Through the above process, the thin film transistor according to the embodiments of the inventive concept may be manufactured.

Experimental Example

Channel part, source/drain electrodes, and gate electrodes may be formed on the substrate. The channel part, the source/drain electrodes and the gate electrodes were formed by patterning indium tin oxide (ITO) deposited on the substrate. The width of the channel was formed to 31.4 nm. The gate electrodes were formed to have a width of 51.2 nm.

Figure 10:
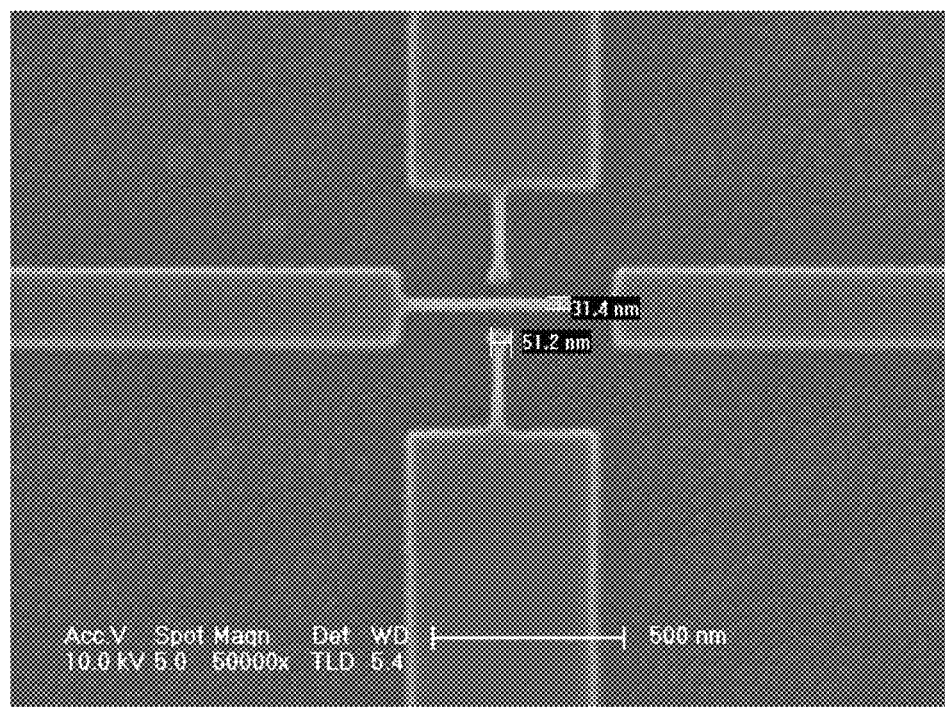
FIGS. 10 and 11 are SEM photographs of an experimental example.
Figure 11:
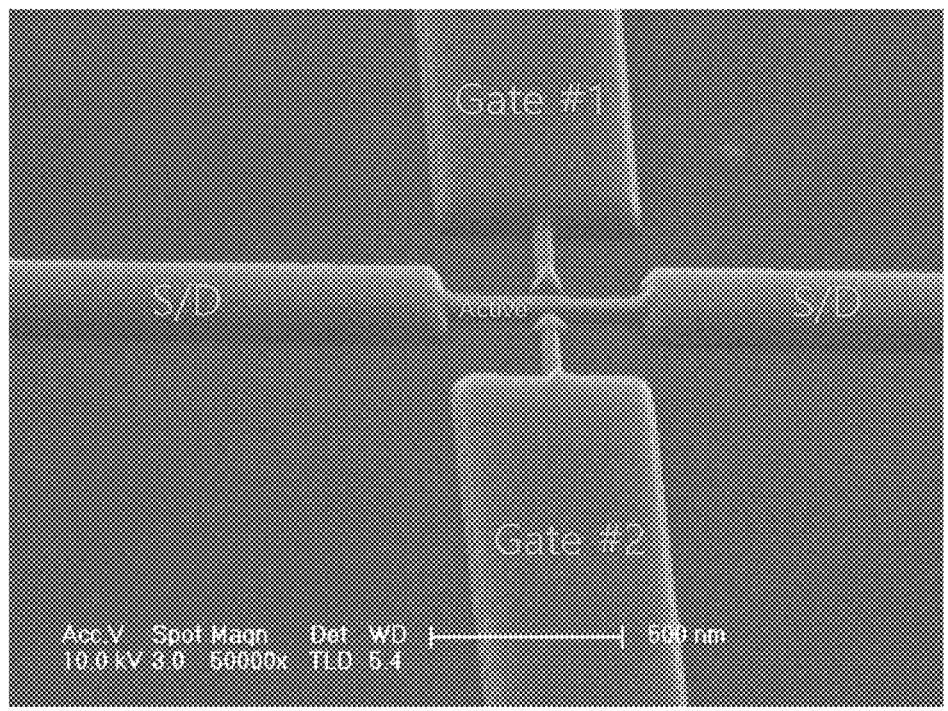

FIGS. 10 and 11 are SEM photographs of an experimental example. As shown in FIGS. 10 and 11, it may be seen that channel part between the source/drain electrodes and the source/drain electrodes are formed. The channel part may be formed to have a thinner width than the source/drain electrodes, and the source/drain electrodes and the channel part may be formed in a single body.

Figure 12:
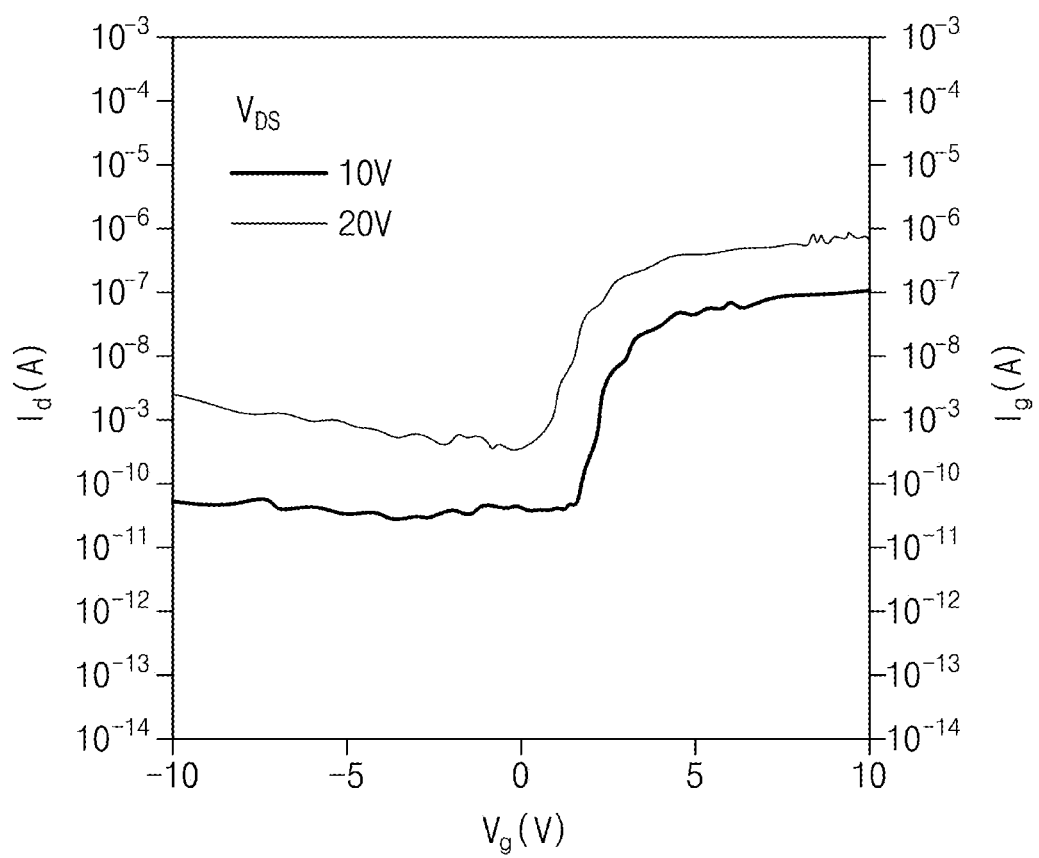
FIG. 12 is a graph measuring electrical characteristics of an experimental example.

FIG. 12 is a graph measuring electrical characteristics of an experimental example. As shown in FIG. 12, when no voltage is applied to the gate electrodes or a negative voltage is applied, it may be seen that the current between the source/drain electrodes does not change. When a voltage of a predetermined amount or more (for example, a voltage of 3 V or more) is applied to the gate electrodes, the current flowing between the source/drain electrodes is increased as compared with the case where no voltage is applied to the gate electrodes. According to FIG. 12, as compared with a case where no voltage is applied to the gate electrodes, when a voltage of a predetermined amount or more is applied to the gate electrodes, it may be seen that the current flowing between the source/drain electrodes is increased by 100 times or more. That is, it may be seen that the amount of current between the source/drain electrodes changes according to the voltage applied to the gate electrodes, and it may be seen that the thin film transistor according to the inventive concept operates as a transistor.

In the thin film transistor according to the embodiments of the inventive concept, the source/drain electrodes may be formed in a single body with a channel part, and the electrical resistance may be improved because the contact resistance between the source/drain electrodes and the channel part is small.

In addition, since source/drain electrodes are formed in a single body with a channel part, structural stability may be improved at the interface between the source/drain electrodes and the channel part.

In addition, since source/drain electrodes include a material having high electrical conductivity, the contact resistance with a metal may be low, and for example, a separate component such as an ohmic contact may not be needed for contact with an external terminal.

The channel part, the source/drain electrodes and the gate electrodes of the thin film transistor according to the embodiments of the inventive concept may be formed using simple processes, and the manufacturing process of the thin film transistor may be simplified.

Although the exemplary embodiments of the inventive concept have been described, it is understood that the inventive concept should not be limited to these exemplary embodiments but various changes and modifications may be made by one ordinary skilled in the art within the spirit and scope of the inventive concept as hereinafter claimed.

What is claimed is:

1. A thin film transistor comprising: a substrate; a channel part extending on the substrate in a first direction parallel to an upper surface of the substrate; source/drain electrodes connected to both ends of the channel part in the first direction; and a gate electrode spaced apart from the channel part in a second direction intersecting the first direction, the second direction being parallel to the upper surface of the substrate; wherein each of the channel part, the source/drain electrodes, and the gate electrode is provided as a single layer; wherein the gate electrode contacts the upper surface of the substrate, and wherein a base of the channel part is sandwiched by a pair of recesses in the upper surface of the substrate.

2. A thin film transistor comprising:
a substrate;
a channel part extending on the substrate in a first direction parallel to an upper surface of the substrate;
source/drain electrodes connected to both ends of the channel part in the first direction; and
a gate electrode spaced apart from the channel part in a second direction intersecting the first direction and parallel to the upper surface of the substrate;
wherein each of the channel part, the source/drain electrodes, and the gate electrode is provided as a single layer;
wherein the channel part, the source/drain electrodes, and the gate electrode are composed of a same material.

3. The thin film transistor of claim 2, wherein the channel part and the source/drain electrodes are composed of a single body.

4. The thin film transistor of claim 2, wherein the channel part, the source/drain electrodes and the gate electrode comprise a conductive metal oxide or a semiconductor material doped with an impurity.

5. The thin film transistor of claim 1, wherein an upper surface of the channel part is located at a lower level than an upper surface of the gate electrode.

6. The thin film transistor of claim 1, wherein a recess of the pair of recesses is toward an inside of the substrate from the upper surface of the substrate.

7. The thin film transistor of claim 6, wherein a bottom surface of the recess is located at a lower level than a lower surface of the channel part and a lower surface of the gate electrode.

8. The thin film transistor of claim 1, wherein the gate electrode is provided in plurality,
wherein the channel part is disposed between the gate electrodes.

9. The thin film transistor of claim 1, further comprising an insulating part provided between the channel part and the gate electrode.

10. The thin film transistor of claim 1, further comprising an insulating part provided between the channel part and the gate electrode;
wherein the gate electrode, the insulating part and the channel part extend a same distance from the upper surface of the substrate in a third direction orthogonal to the first direction and the second direction.

11. The thin film transistor of claim 1, further comprising an insulating part provided between the channel part and the gate electrode; wherein the insulating part extends into the pair of recesses.

* * * * *